United States Patent
Naito et al.

(10) Patent No.: US 7,714,602 B2
(45) Date of Patent: May 11, 2010

(54) SOCKET FOR CONNECTING BALL-GRID-ARRAY INTEGRATED CIRCUIT DEVICE TO TEST CIRCUIT

(75) Inventors: Masahito Naito, Sagamihara (JP); Takayuki Nagumo, Sagamihara (JP)

(73) Assignee: 3M Innovative Properties Company, St. Paul, MN (US)

( * ) Notice: Subject to any disclaimer, the term of this patent is extended or adjusted under 35 U.S.C. 154(b) by 4 days.

(21) Appl. No.: 11/569,418

(22) PCT Filed: Apr. 13, 2005

(86) PCT No.: PCT/US2005/012349

§ 371 (c)(1),
(2), (4) Date: Nov. 20, 2006

(87) PCT Pub. No.: WO2005/116666

PCT Pub. Date: Dec. 8, 2005

(65) Prior Publication Data

US 2008/0024151 A1   Jan. 31, 2008

(30) Foreign Application Priority Data

May 25, 2004   (JP)   ............................. 2004-154912

(51) Int. Cl.
*G01R 31/26*   (2006.01)
*G01R 31/02*   (2006.01)
(52) U.S. Cl. ..................... 324/765; 324/755; 324/760
(58) Field of Classification Search ............. 324/158.1, 324/754–765; 439/68–73, 259–270
See application file for complete search history.

(56) References Cited

U.S. PATENT DOCUMENTS

| 5,256,080 | A | * | 10/1993 | Bright | ........................ 439/342 |
| 5,493,237 | A | * | 2/1996 | Volz et al. | .................... 324/754 |
| 5,498,970 | A | | 3/1996 | Petersen | |
| 5,611,705 | A | | 3/1997 | Pfaff | |
| 5,807,127 | A | | 9/1998 | Ohshima | |
| 5,865,639 | A | * | 2/1999 | Fuchigami et al. | .......... 439/330 |
| 5,923,179 | A | * | 7/1999 | Taylor | ........................ 324/755 |
| 6,046,597 | A | * | 4/2000 | Barabi | ........................ 324/755 |

(Continued)

FOREIGN PATENT DOCUMENTS

EP   0574157   12/1993

(Continued)

*Primary Examiner*—Ha Tran T Nguyen
*Assistant Examiner*—Joshua Benitez
(74) *Attorney, Agent, or Firm*—Johannes P. M. Kusters; Melanie G. Gover

(57) ABSTRACT

A simple structure socket 10 for connecting a ball grid array integrated circuit device to a test circuit has a base 14, contacts 26 arranged corresponding to the ball grid array, a nest assembly 16 of two comb structures 70 and a lever assembly 18 for spacing opposed tip portions of each contact away from each other to define a gap for receiving a ball. The lever assembly has two rectangular frames 86 each made of a distal cross piece 94, a proximal cross piece and two side pieces connecting the distal and proximal cross pieces. The two rectangular frames are arranged so that the side pieces are intersected at substantially mid portions thereof. This allows that, by depressing the proximal cross pieces toward the base, the distal cross pieces forces the comb structures toward each other.

2 Claims, 6 Drawing Sheets

U.S. PATENT DOCUMENTS

| | | | |
|---|---|---|---|
| 6,160,709 | A | 12/2000 | Li |
| 6,208,155 | B1 * | 3/2001 | Barabi et al. ................ 324/754 |
| 6,262,581 | B1 * | 7/2001 | Han .......................... 324/755 |
| 6,280,219 | B1 * | 8/2001 | Sano et al. ................... 439/268 |
| 6,638,091 | B2 | 10/2003 | Yamagishi |
| 6,666,691 | B2 | 12/2003 | Ikeya |
| 6,749,443 | B2 | 6/2004 | Sano et al. |
| 6,752,645 | B2 * | 6/2004 | Nakamura et al. .......... 439/330 |
| 6,827,599 | B1 * | 12/2004 | Gattuso et al. ............. 439/342 |
| 6,875,025 | B2 * | 4/2005 | Hsu et al. ..................... 439/71 |
| 6,899,558 | B2 | 5/2005 | Okamoto |
| 6,969,266 | B2 * | 11/2005 | Chu et al. ..................... 439/70 |
| 7,189,092 | B2 * | 3/2007 | Piatti .......................... 439/330 |
| 7,214,084 | B2 | 5/2007 | Hayakawa |
| 7,278,868 | B2 | 10/2007 | Sato et al. |
| 7,548,422 | B2 * | 6/2009 | Hsieh .......................... 361/695 |
| 2001/0002345 | A1 | 5/2001 | Ohshima |
| 2003/0032322 | A1 * | 2/2003 | Nakamura et al. .......... 439/330 |
| 2003/0109163 | A1 | 6/2003 | Mastromatteo et al. |
| 2005/0231919 | A1 * | 10/2005 | Ujike et al. ................. 361/719 |

FOREIGN PATENT DOCUMENTS

| | | |
|---|---|---|
| EP | 0400967 | 12/2004 |
| JP | 1114057 | 5/1989 |
| WO | WO 9703467 | 1/1997 |
| WO | WO 0161364 | 8/2001 |

* cited by examiner

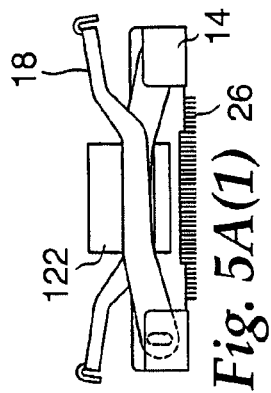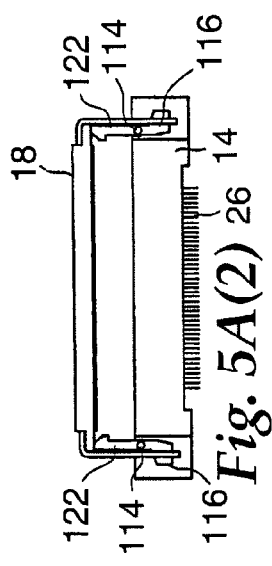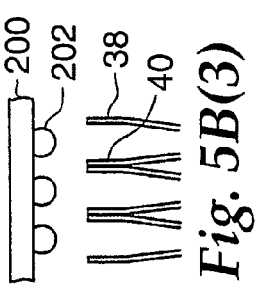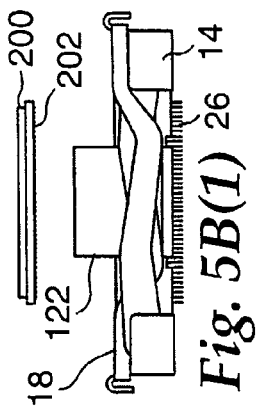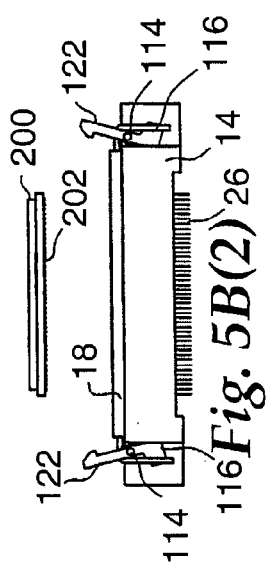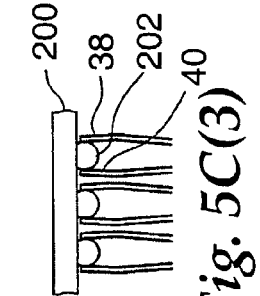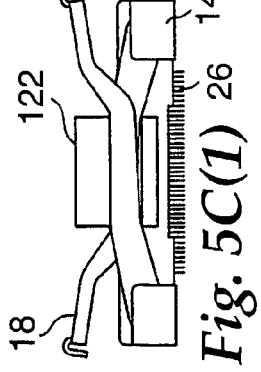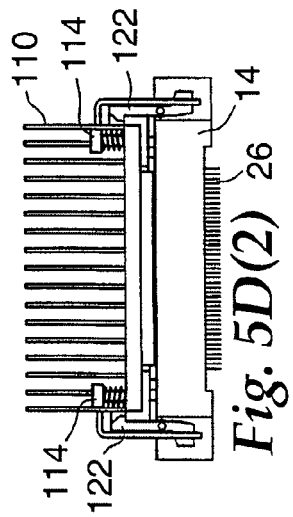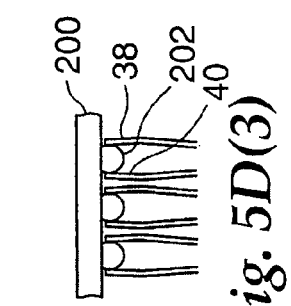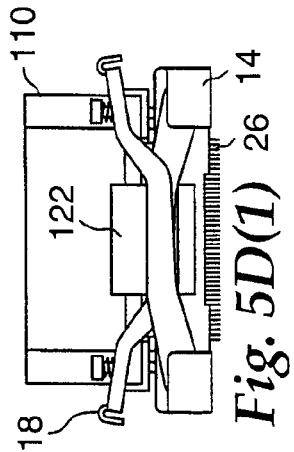

SOCKET FOR CONNECTING BALL-GRID-ARRAY INTEGRATED CIRCUIT DEVICE TO TEST CIRCUIT

FIELD

The present invention relates to a socket for connecting a ball grid array (BGA) integrated circuit device to a test circuit therefor.

BACKGROUND

U.S. Pat. No. 5,498,970 discloses a socket for temporary connection of a ball grid array (BGA) integrated circuit device to a test circuit. The socket has a pattern of contacts corresponding to a ball grid array of the integrated circuit device. Each of the contacts has a set of two cantilever arms and terminating in tips adapted to capture one solder ball of the ball grid array integrated circuit. A nest structure is provided for causing the each pair of tips to move between an open position in which the tips are spaced away from each other sufficiently for receiving the associated solder ball and a closed position in which the tips are resiliently forced to grasp the ball. The nest structure is made of a pair of opposed combs each having a number of parallel cantilever racks with spaced projections and assembled with each other so that the racks of two combs are positioned alternately. The assembled nest structure is mounted on the contacts so that each of the projections of one comb engages with one of the tips of the contact and each of the projections of the other comb engages with the other of the tips. This allows that, by the movement of the combs in opposite directions, the paired tips of each contact move away from each other to move between the open and closed positions. This action is performed by an operation mechanism made of two U-shaped brackets each having a cross piece and two upstanding arms extending substantially perpendicular to the cross piece. The two bracket are nested facing each other and have the arms pinned to each other at approximately their midpoints with a hole. The nested brackets are provided around the combs so that one longitudinal upper edge of each cross piece is brought into contact with an outer surface portion of the associated comb. Also, a rectangular top cover is placed on the brackets so that a bottom of the cover faces and contacts with opposite ends of the upstanding arms, away from the cross piece. This allows that, simply by depressing the top cover with a downward pressure, the brackets rotate to each other and to have the longitudinal upper edges of the cross pieces force the combs toward each other, which results in that the paired tips are moved to the open position. Then, simply by releasing the downward pressure, the paired tips spring back their free positions.

According to the conventional socket, the BGA circuit device is easy to be connected with the test circuit through a simple action. However, an open space on the BGA integrated circuit is restricted within the rectangular top cover. This in turn restricts the size of a heat sink mounted on the BGA for dissipation of heat generated at the testing BGA circuit device.

SUMMARY

Therefore, an aspect of the present invention provides a test socket for temporary connection of a ball grid array integrated circuit device to a test circuit has
 a base of electrically insulating material;
 an array of contacts supported by the base, the array including a pattern of contacts corresponding to the ball grid array of the integrated circuit device, each contact including a set of two cantilever arms opposing to each other and terminating in tip portions adapted to grasp one ball of the ball grid array integrated circuit device;
 a nest assembly having two comb structures, each comb structure having an end frame and a plurality of parallel cantilever racks each with projections, the two comb structures being combined so that the cantilever racks of two comb structures are positioned alternately and are capable of moving in a direction parallel to the combined cantilever arms, the nest assembly being combined with the array of contacts so that the one of each contact is engaged with the projection of the cantilever rack of one comb structure and the other of each contact is engaged with the projection of the cantilever rack of the other comb structure, allowing the each opposing tips of the contacts to move between the free and opened states by the movement of the comb structures in the direction parallel to the cantilever racks; and
 a lever assembly for spacing the opposing paired tips of the contacts away from each other to define a gap therebetween adapted to receive the ball, the lever assembly having two rectangular frames including a pair of distal and proximal cross member and a pair of side members connecting between the opposite ends of the distal and proximal cross members to form the rectangular frame, the two rectangular frames being assembled with the side members of the frames intersected with each other at substantially mid-portions thereof, the lever assembly so assembled being positioned on the base so that the distal cross members are capable of forcing the end frames of the comb structures toward each other by depressing the proximal cross members of the lever assembly.

According to the socket so constructed, the side pieces of the lever assembly are connected at their proximal ends to the proximal cross piece the depressing pressure is applied. This eliminates a top plate which would occupy a large space above the BGA integrated circuit device and thereby prevent the use of larger heat sink. This in turn means that a larger heat sink is used to effectively remove heat generated from the BGA integrated circuit during its test.

BRIEF DESCRIPTION OF THE DRAWINGS

The details of the present invention, both as to its structure and operation, can best be understood in reference to the accompanying drawings, in which like reference numerals refer to like parts.

FIGS. 5A1-5D1, 5A2-5D2 and 5A3-5D3 are a series of schematic views, i.e., front views of the socket, side elevational views of the socket and a combination of the tip portions of the contact and the solder ball, for describing the mounting and dismounting operations of the BGA integrated circuit device.

DETAILED DESCRIPTION

Figure 1:
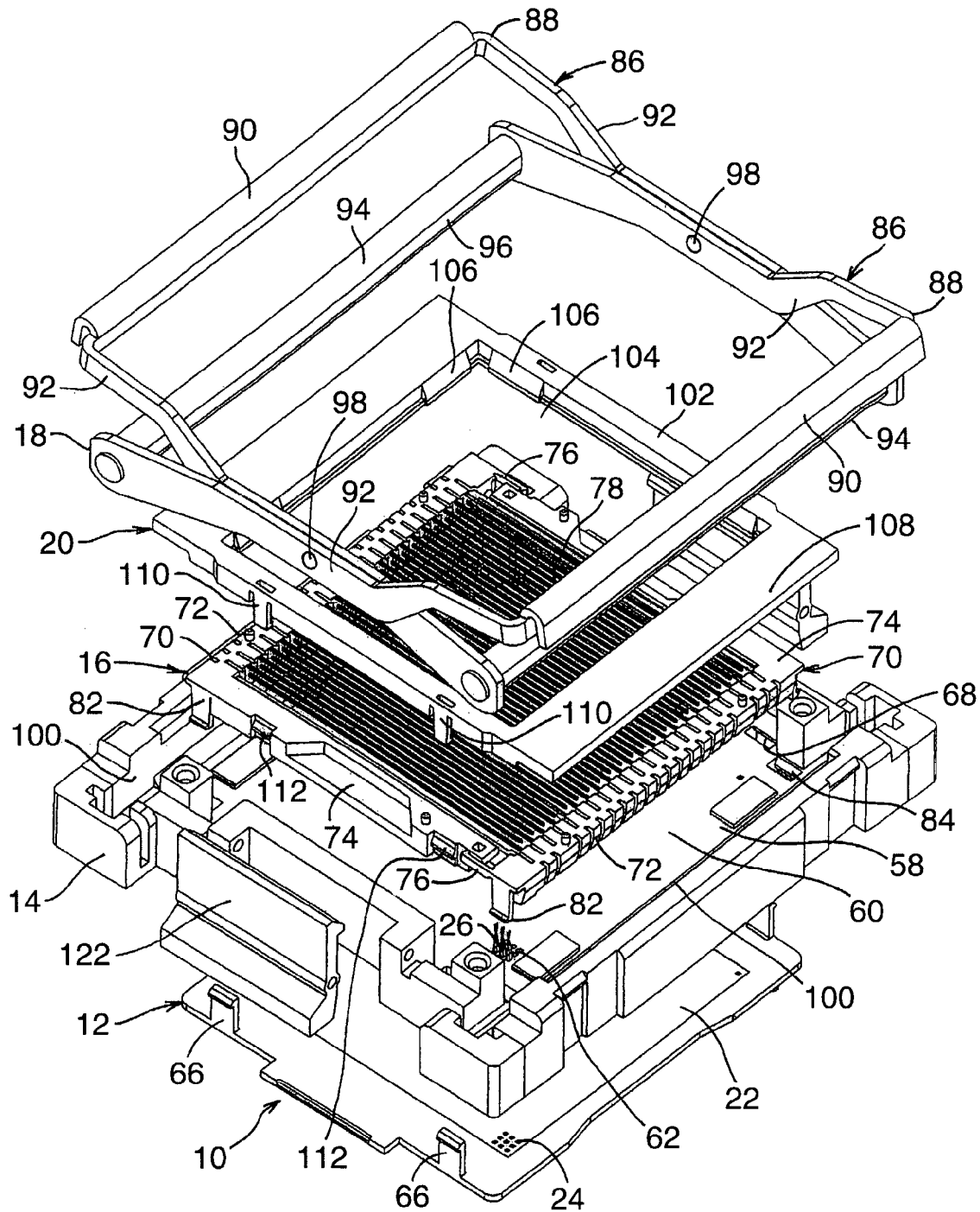
FIG. 1 is an exploded perspective view of a socket of an embodiment according to the present invention.

Referring to FIG. 1, there is illustrated a socket for connection of the ball grid array (BGA) integrated circuit device to a test circuit, generally indicated by reference numeral 10. The socket 10 has at least an alignment plate 12, a base 14, a nest assembly 16, a lever assembly 18 and a package guide 20.

The alignment plate 12, which is made of electrically insulating material, has a rectangular surface region 22 in which a number of through-holes 24 for aligning contacts 30, in particular legs 50 (see FIG. 2) of the contacts 30, are defined in an array of rows and columns arranged at regular intervals in a first direction indicated by alphabet X and a second direction indicated by alphabet Y, perpendicular to the first direction.

Figure 2:
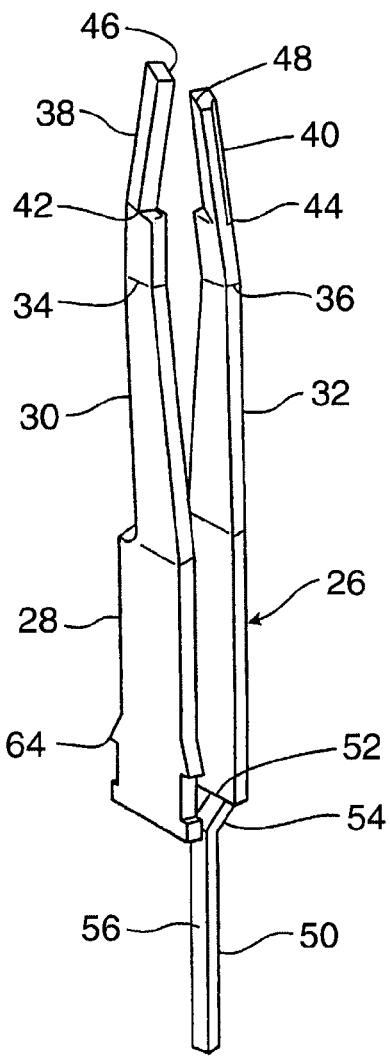
FIG. 2 is an enlarged perspective view of a contact provided in the socked in FIG. 1.
Figure 3:
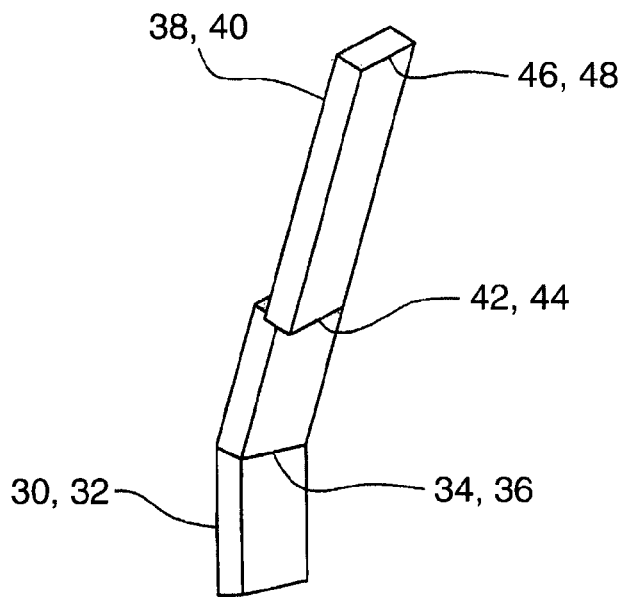
FIG. 3 is an enlarged perspective view of a tip portion of the contact in FIG. 2.

Referring to FIG. 2, the contact 26, which is made of resilient, electrically conductive material such as copper or copper alloy, has a substantially U-shaped cross sectional mid portion 28. Opposite ends of the U-shaped portion 28 are extended upwardly to form cantilever arms 30 and 32. The cantilever arms 30 and 32 are bent at first level portions 34 and 36 at the same angle inwardly, toward each other. Further, tip portions 38 and 40 of the cantilever arms 30 and 32 are twisted at a certain angle about their longitudinal axes in the same direction at second level portions 38 and 40 (see FIG. 3) so that, in a free state shown in FIG. 2, surfaces 46 and 48 of the tip portions 38 and 40 face in a staggered fashion, leaving a space therebetween. One of the opposite ends of the U-shaped portion 28 is also extended downwardly to form an insertion leg 50. Preferably, the insertion leg 50 is angled at two, different level portions 52 and 54, adjacent the U-shaped portion 28, to position the lower major portion 56 of the leg 50 at a mid-center of the staggered tip portions 38 and 40. Each of the contacts 26 so constructed is securely mounted with its U-shaped mid portion inserted in a through-hole 62 (see FIG. 1) defined in the base 14 and also with its insertion leg 50 inserted in the through-hole 24 defined in the alignment plate 12 as it is electrically connected to a test circuit (not shown) provided underneath the base 14. Also, the cantilever arms 30 and 32 are opposed to each other in X-direction, and the angled tip portions 38 and 40 occupy different positions with respect to Y-direction.

The contact 26 may be manufactured in various ways. For example, a metal plate is punched out to produce an unbent original which is twisted at portions 42 and 44, bent at portions 34 and 36, also bent at portions 52 and 54, and finally bent at its mid-portion to form the U-shaped portion 28. The bending and twisting processes may be performed in different order.

Referring back to FIG. 1, the base 14, which is made of electrically insulating material, has a top portion 58 defining a rectangular surface region 60 corresponding to the surface region 22 of the alignment plate 12. The surface region 60 has a number of through-holes 62 defined therein and arranged in the same manner as those of the alignment plate 12, each of which holds the U-shaped portions 32. Then, each contact 26 supported by the base 14 with its mid portion 28 inserted within the through-hole 62 of the base 14 and also with at least the staggered tip portions 38 and 40 exposed above the top surface of the base 14.

Preferably, as shown in FIG. 2, the contact 26 has a wedge 64 defined at the mid portion 28 thereof. This allows that, when the contact 26 is inserted within the through-hole 62, the wedge 64 engages with the inner surface of the through-hole 62, which ensures that the contact 26 is retained in a stable manner. Also, preferably, the alignment plate 12 and the base 14 are connected with each other using a snap-fit mechanism made of, for example, four upright legs 66 (only two legs are fully illustrated in the drawing) provided at respective corners of the alignment plate 12 and four recesses or through-holes 68 into which the legs 66 are inserted and then mechanically engaged with respective portions of the base 14.

Referring also to FIG. 1, the nest assembly 16, which is described in detail in the U.S. Pat. No. 5,498,970, has a pair of comb structures 70. Each of the comb structures 70, which is made of electrically insulating material, has an end frame portion 72 and a pair of side frame portions 74 and 76 extending in the same direction from and substantially perpendicular to the end frame portion 72. In this embodiment, the side frame portions 74 and 76 have different lengths, however, they may have the same length. The end frame portion 72 also supports a number of cantilever racks 78 extending therefrom, between the side frame portions 74 and 76 at regular intervals. As best shown in FIGS. 4A to 4D, each rack 78 has engagement portions or projections 80 provided on opposite sides facing the neighboring racks for engagement with contacts. Neighboring racks 78 define a space therebetween which is slightly greater than the width of the rack, which allows that the comb structures 70 are assembled to each other with the cantilever racks 78 of the comb structures 70 positioned alternately.

Figure 4A:
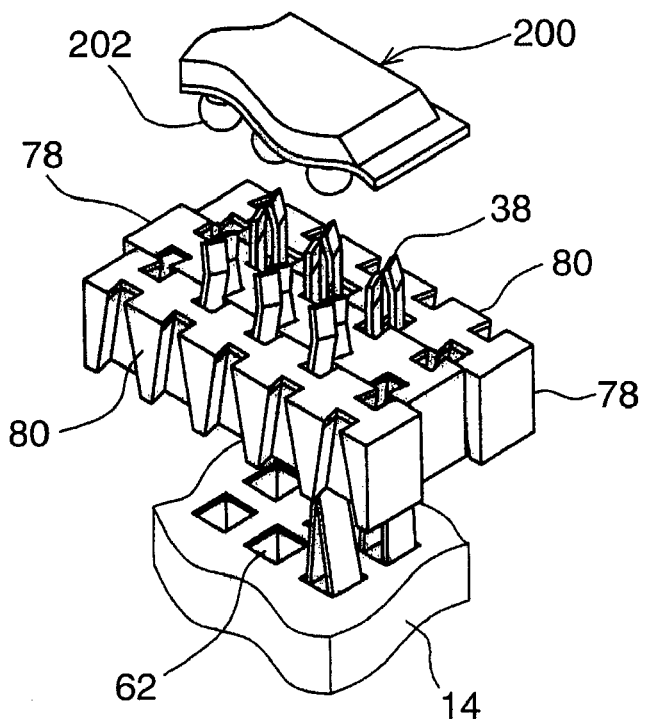
FIG. 4A is a partial enlarged perspective view showing a movement of a nest assembly and contacts, in which the tip portions of the contacts take a free state.
Figure 4B:
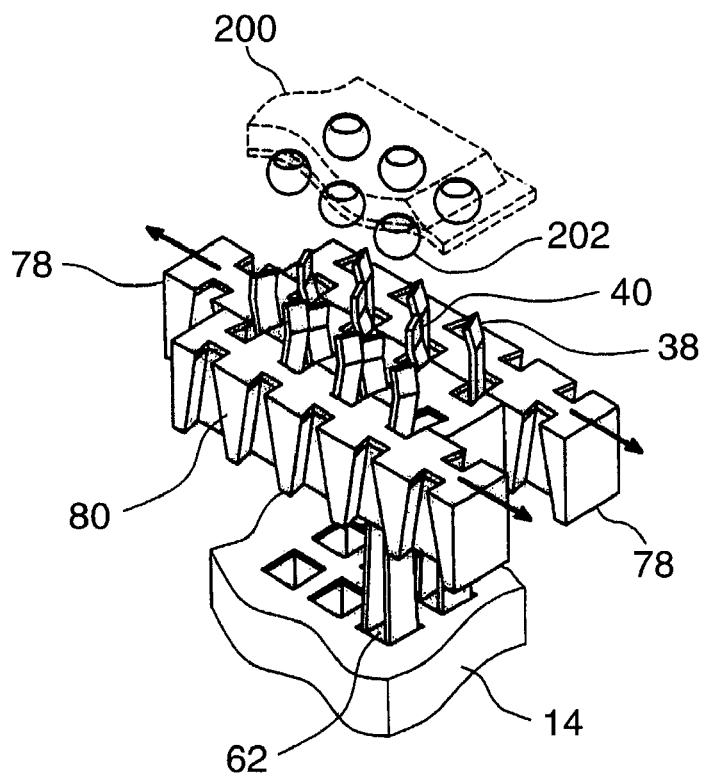
FIG. 4B is a partial enlarged perspective view showing a movement of a nest assembly and contacts, in which the tip portions of the contacts take an open state.
Figure 4C:
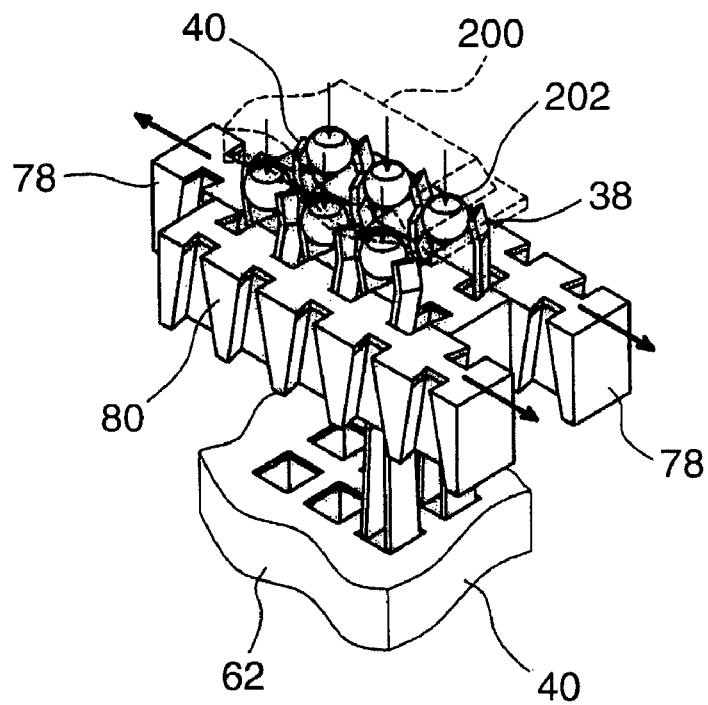
FIG. 4C is a partial enlarged perspective view showing a movement of a nest assembly and contacts, in which the tip portions of the contacts are moving from the free state to a closed state.
Figure 4D:
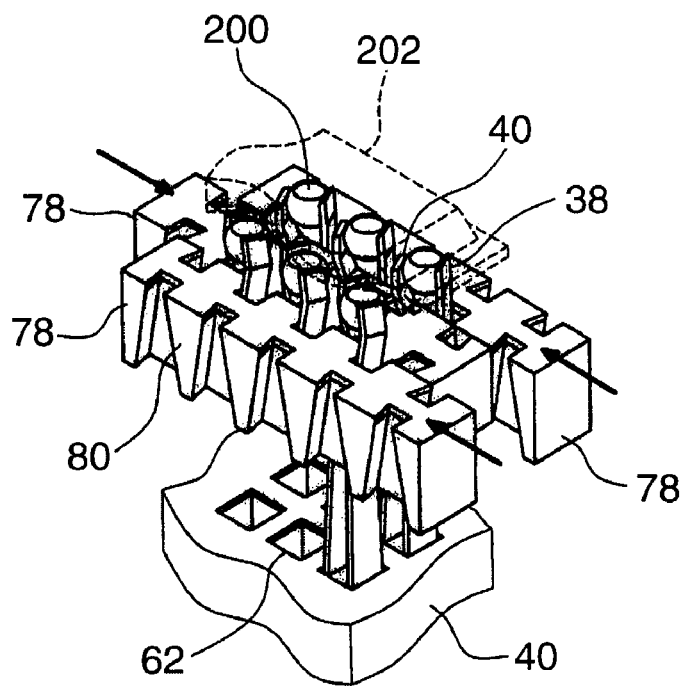
FIG. 4D is a partial enlarged perspective view showing a movement of a nest assembly and contacts, in which the tip portions of the contacts are moving from the closed state to the open state.
Figure 6:
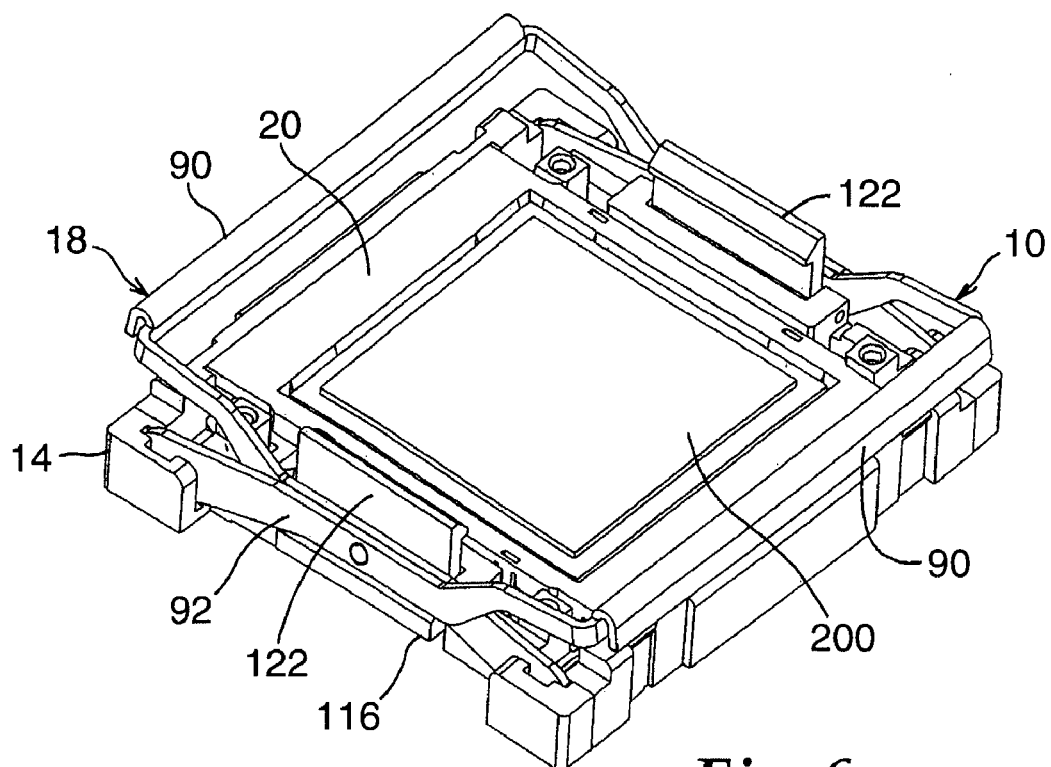
FIG. 6 is a perspective view socket onto which the BGA integrated circuit device is mounted.

Referring back to FIG. 1, the nest assembly 16 so assembled is mounted on the base 14 with the cantilever racks 78 directed in X-direction. Also, as shown in FIG. 4A, for example, the tip portions 38 are positioned between the neighboring projections 80 of the racks 78 of one comb structure 70 and the tip portions 40 of the contact 26 is positioned between the neighboring projections 80 of the comb structure 70 of the other comb structure 70. This allows that, as shown in FIGS. 4A-4D, when the comb structures 70 are forced toward each other against the resiliency of the cantilever arms 30 and 32, the paired tip portions 38 and 40 are forced from its free state (FIG. 4C) to an open state (FIG. 4D) in which the tip portions 38 and 40 are spaced apart from each other sufficiently for receiving the solder ball 202 therebetween.

In order to ensure the relative movement of the comb structures 70, the nest assembly 16 is provided to the base 14 so that at least one of the comb structures 70 moves to and from the other. For this purpose, according to the embodiment, as best shown in FIG. 1, each of the comb structures 70 has engagement legs 82 (only one of which is indicated in the drawing) at its opposite ends of the end frame portion 72. The base 14, on the other hand, has four engagement holes 84 (only one of which is fully indicated in the drawing) into each of which the corresponding engagement legs 82 is inserted and then engaged. Also, the size of the engagement holes 84 in X-direction is larger than that of the corresponding legs 82 so that the legs 82 inserted therein can move slightly in X-direction, allowing the above-mentioned relative movement of the comb structures 70 in that direction between the free state and the opened state.

Referring again to FIG. 1, the lever assembly 18 has two rectangular frames 86. The frame 86, which is made of a highly rigid material, has a major frame portion 88 in the form of bracket. The major frame portion 88 has a proximal end, cross piece 90 and two side pieces 92 extending substantially perpendicular from opposite ends of the proximal end piece 90. Preferably, the major frame portion 88 is made by bending an elongate flat bar. The frame 86 also has a bar-like distal end, cross piece 94, extending substantially parallel to the proximal end piece 90 and securely connected to the distal ends of the side frame pieces 92. In particular, the distal end portion 94 has a flat surface portion 96 opposing the proximal end portion 90, which is preferably made by chamfering an outer periphery of a round rod in its longitudinal direction. Alternatively, the distal end piece 94 may be made of a flat bar. The two rectangular frames 86 are crossed with each other with the side portions 92 of one frame 86 faced to those of the other frame 86, respectively, to form the lever assembly 18. The adjoining side frame pieces 92 may be connected at their substantially mid-portions by a pin and hole mechanism 98.

The crossed lever assembly 18 is mounted on the base 14 so that each of the distal end cross pieces 94 is restricted between the end frame portion 72 and the opposing wall portion of the base 14. Preferably, in order to retain the chamfered surface portions 96 of the lever assembly 18 in contact with the rear surface of the end frame portions 72, the base 14 has elongated grooves 100 defining the wall portions and extending in Y-direction behind the end frames 82, in which the distal end pieces 94 are received without any travel. This allows that, when the proximal end pieces 90 are depressed downwardly, the distal end pieces 94, in particular the chamfered surface portions 96, rotate to press the end frame portions 72 of the nest assembly 16 toward each other, causing the tip portions 38 and 40 of the contacts 30 to move from the free state to the open state. When, on the other hand, the downward pressure is removed, each of the tip portions 38 and 40 spring back by its resiliency from the open state toward the free state.

The package guide 20, which is made of electrically insulating material and used to guide the BGA integrated circuit device into a suitable position of the nest assembly 16, has a rectangular frame 102 defining a rectangular opening 104 corresponding to an outline of the integrated circuit device. Preferably, in order to facilitate the insertion of the integrated circuit device into the opening 104, the opposing inner peripheral portions of the rectangular frame 102 have projections 106 each inclined inwardly and downwardly. Also preferably, frame portions adjacent to and above the distal end pieces 94 are extended outwardly to define retainers 108 for retaining the distal end pieces 94 of the lever assembly 18 within the grooves 100. The package guide 20 so constructed is secured on the nest assembly 16 with an engagement mechanism made of, for example, legs 110 of the package guide 20 (only two legs are indicated in the drawing) and recesses 112 of the nest assembly 16 capable of engaging with the legs 110. Alternatively, the package guide 20 is secured to the base 14 with its portions engaged with associated recesses.

In operation of the socket 10 so constructed, the proximal end portions 90 of the lever assembly 18 are pressed downwardly to establish an electrical connection of BGA circuit device 200 (FIGS. 4A-AD) to a test circuit provided underneath the alignment plate 12 and to which the legs 50 of the contacts 26 are already connected (see FIGS. 5A1-5A2 and 5B1-5B2). This causes the opposing surfaces 96 of the distal end pieces 94 rotate to force the end frame portions 72 of the nest assembly 16 toward each other, which results in that the tip portions 38 and 40 of each of the contacts 26 are spaced away from each other to form a gap therebetween (see FIG. 4D) into which a solder ball 202 on the bottom surface of the BGA circuit device 200 is placed (see FIGS. 4B, 4C, 5A3 and 5B3). Then, the downward pressure is removed. This results in that the comb structures 70 are forced away from each other by the resiliency of the cantilever arms 30 and 32 of the contacts 26, moving the tip portions 38 and 40 back into a closed state in which the solder balls 202 are grasped by the staggered tip portions 38 and 40. In this state, the BGA integrated circuit device 200 is electrically connected to the test circuit (see FIGS. 4D, 5C1-5C3 and 6). After completion of the test of the BGA integrated circuit device 200, the proximal end pieces 90 of the lever assembly 18 are again depressed downwardly, causing the tip portions 38 and 40 to move from the closed state to the open state in which the tip portions 38 and 40 are spaced away from the solder balls 202 (FIGS. 4C, 5B1-5B3). This allows the BGA integrated circuit device 200 to be removed from the socket 10 and disconnected from the test circuit.

Figure 7:
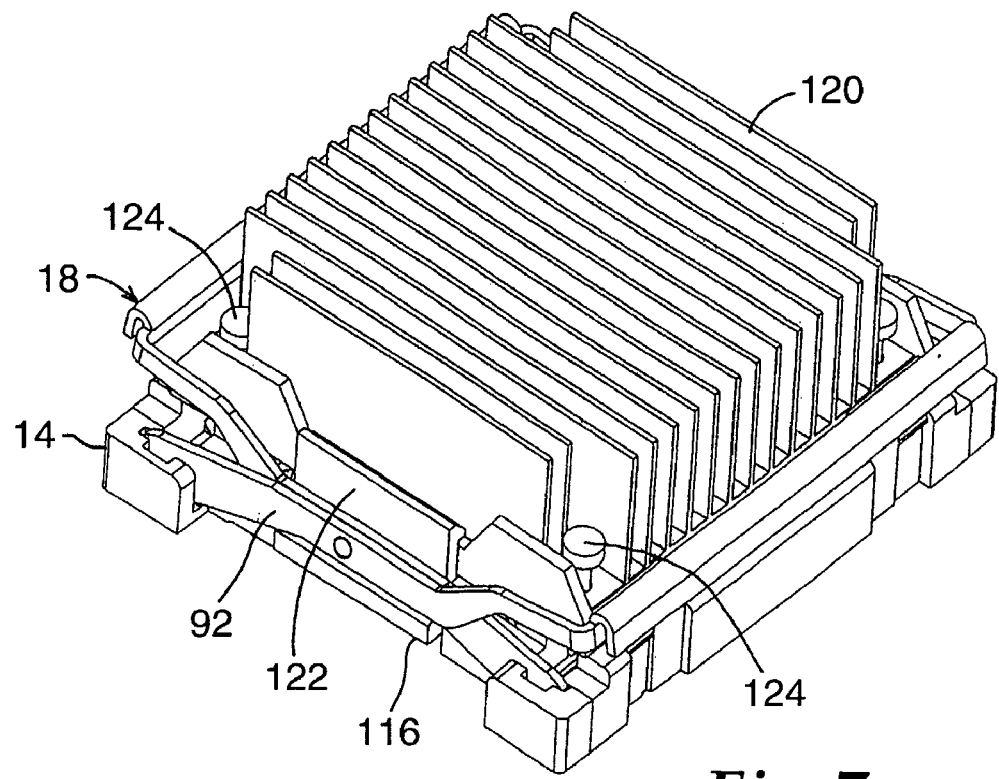
FIG. 7 is a perspective view of the socket onto which the heat sink is mounted.

As shown in FIG. 7, a heat sink generally indicated by reference numeral 120 may be mounted on the BGA integrated circuit device 200 held by the socket 10 in order to dissipate heat generated from the BGA integrated circuit device 200 during the test. Although a fin-type heat sink is illustrated in the drawing, it may be of any type such as pin-type heat sink.

Preferably, as shown in FIGS. 1 and 7, a pair of latches 122 are rotatably mounted on the opposite sides of the base 14 for retaining the heat sink 120 in position during the test of the BGA integrated circuit device 200. In this instance, as shown in FIGS. 5A2, 5B2, 5C2 and 6, each of the latches 122 is preferably supported for rotation at its substantially mid portion by a horizontal shaft 114 and its top end is biased inwardly by a suitable spring (not shown). Also, a lower portion of the latch 122 is projected outwardly to form an engaging portion 116. This results in that, when the lever assembly 18 is depressed downwardly, the side pieces 92 of the lever assembly 18 bring into contact with the associated engaging portions 116 of the latches 122, causing the latches 122 to rotate outwardly to take respective positions, i.e., disengaging positions, where the latches 122 disengage with the heat sink 120. Then, when the lever assembly 18 extends upwardly and thereby the side frame pieces 92 of the lever assembly disengage from the engaging portions 116, the latches 122 are brought back by the springs to the original positions where the latches can engage with the heat sink 120. This means that the latches 122 moves between the disengaging and engaging positions by the downward and upward movement, i.e., depressing and undepressing movement of the lever assembly 18. This in turn means that the heat sink 120 can be mounted and dismounted easily.

Also, a suitable spring mechanism, made of pin 124 and spring not shown, for example, is provided to control a depressing force of the heat sink, thereby establishing a stable contact between the heat sink 120 and the BGA integrated circuit device 200.

As fully described above, the side frame pieces of the lever assembly is connected at its proximal ends to the proximal end pieces to which the depressing pressure is applied. This eliminates a top plate which would occupy a large space above the BGA integrated circuit device and thereby prevent the use of larger heat sink. This in turn means that a larger heat sink is used to effectively remove heat generated from the BGA integrated circuit during its test. Also, a socket capable of being used for the BGA circuit device with an enlarged energy consumption is easy to be designed.

Also, the contact 26 described above is featured that it is bend at the first level portions 34 and 36 and twisted at the second level portions 42 and 44, closer to the tip ends of the cantilever arms 30 and 32, respectively. This significantly reduces a variation of the gap between the opposing tip portions of the contact, establishing a stable contact between the contact and the solder ball.

Although the invention has been fully described with respect to only a single embodiment, it will be recognized to those skilled in the art that many modifications and changes are possible. For example, each of the rectangular frame 86 of the lever assembly 18 may be made from a punched-out single plate.

What is claimed is:

1. A test socket for temporary connection of a ball grid array integrated circuit device to a test circuit, the test socket comprising:
    a base of electrically insulating material;
    an array of contacts supported by the base, the array including a pattern of contacts corresponding to the ball grid array of the integrated circuit device, each contact including a set of two cantilever arms opposing to each other and terminating in tip portions adapted to grasp one ball of the ball grid array integrated circuit device;
    a nest assembly having two comb structures, each comb structure having an end frame and a plurality of parallel cantilever racks each with projections, the two comb structures being combined so that the cantilever racks of two comb structures are positioned alternately and are capable of moving in a direction parallel to the combined cantilever arms, the nest assembly being combined with the array of contacts so that the one of each contact is engaged with the projection of the cantilever rack of one comb structure and the other of each contact is engaged with the projection of the cantilever rack of the other comb structure, allowing the each opposing tips of the contacts to move between the free and opened states by the movement of the comb structures in the direction parallel to the cantilever racks;
    a lever assembly for spacing the opposing paired tips of the contacts away from each other to define a gap therebetween adapted to receive the ball, the lever assembly having two rectangular frames including a pair of distal and proximal cross member and a pair of side members connecting between the opposite ends of the distal and proximal cross members to form the rectangular frame, the two rectangular frames being assembled with the side members of the frames intersected with each other at substantially mid-portions thereof, the lever assembly so assembled being positioned on the base so that the distal cross members are capable of forcing the end frames of the comb structures toward each other by depressing the proximal cross members of the lever assembly; and
    latches mounted to the base each latch capable of engaging and disengaging with a heat sink mounted on the ball grid array integrated circuit device in response to a movement of the lever assembly.

2. The socket of claim 1, wherein the paired cantilever arms of each contact are bent toward each other at first level portions thereof and twisted about longitudinal axes thereof in the same direction at second level portions thereof closer to the tip portions than the first lever portions.

* * * * *